United States Patent
Overweg

(10) Patent No.: US 7,417,432 B2
(45) Date of Patent: Aug. 26, 2008

(54) ASYMMETRIC ULTRA-SHORT GRADIENT COIL FOR MAGNETIC RESONANCE IMAGING SYSTEM

(75) Inventor: Johannes Overweg, Uelzen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/598,467

(22) PCT Filed: Feb. 17, 2005

(86) PCT No.: PCT/IB2005/050604

§ 371 (c)(1),
(2), (4) Date: Aug. 31, 2006

(87) PCT Pub. No.: WO2005/088330

PCT Pub. Date: Sep. 22, 2005

(65) Prior Publication Data

US 2007/0188173 A1   Aug. 16, 2007

Related U.S. Application Data

(60) Provisional application No. 60/549,751, filed on Mar. 3, 2004.

(51) Int. Cl.
*G01V 3/00* (2006.01)
(52) U.S. Cl. ..................................................... 324/318
(58) Field of Classification Search ......... 324/300–322; 600/410–435; 333/219–235
See application file for complete search history.

(56) References Cited

U.S. PATENT DOCUMENTS 5,465,719 A    11/1995   Itagaki et al.
5,497,089 A *   3/1996   Lampman et al. ........... 324/318
5,512,828 A *   4/1996   Pausch et al. ............... 324/309

(Continued)

FOREIGN PATENT DOCUMENTS

JP    200083921 A    3/2000

(Continued)

OTHER PUBLICATIONS

Crozier, S., et al., A Design Methodology for Short, Whole-Body, Shielded Gradient for MRI; 1995; Magnetic Resonance Imaging; 13(4)615-620.

(Continued)

*Primary Examiner*—Brij B Shrivastav
*Assistant Examiner*—Dixomara Vargas

(57) ABSTRACT

A magnetic field gradient coil includes upper and lower sections (40, 42) that define a coil bore (44) therebetween. The upper section (40) has an arcuate curvature ($C_{upper}$) transverse to a longitudinal direction and a length ($L_{upper}$) in the longitudinal direction that is smaller than a longitudinal length ($L_{lower}$) of the lower section (42). Gradient coil windings (70, 72, 74, 76, 102, 104, 112, 114) impose one or more transverse magnetic field gradients on a static magnetic field generally oriented in the longitudinal direction. The windings are supported by the upper and lower sections (40, 42) of the coils support. The windings supported by the upper section (40) are longitudinally limited in distribution to the longitudinal length ($L_{upper}$) of the upper section (40), which is shorter than its diameter. The windings supported by the lower section (42) are longitudinally distributed across substantially the length ($L_{lower}$) of the lower section (42).

19 Claims, 4 Drawing Sheets

U.S. PATENT DOCUMENTS

| | | | |
|---|---|---|---|
| 5,576,623 A * | 11/1996 | Muller | 324/318 |
| 5,581,185 A | 12/1996 | Petropoulos et al. | |
| 5,646,532 A * | 7/1997 | Knuttel et al. | 324/321 |
| 5,708,360 A * | 1/1998 | Yui et al. | 324/318 |
| 5,939,882 A * | 8/1999 | Gebhardt et al. | 324/318 |
| RE36,881 E * | 9/2000 | Muller | 324/318 |
| 6,377,148 B1 | 4/2002 | Forbes et al. | |
| 6,429,655 B1 | 8/2002 | Overweg | |
| 6,462,636 B1 | 10/2002 | Overweg et al. | |
| 6,466,812 B1 | 10/2002 | Overweg et al. | |
| 6,556,011 B1 * | 4/2003 | Yui | 324/318 |
| 6,618,606 B2 | 9/2003 | Overweg et al. | |
| 2002/0050820 A1 | 5/2002 | Overweg | |

FOREIGN PATENT DOCUMENTS

| | | |
|---|---|---|
| WO | WO 02095435 A1 | 11/2002 |
| WO | WO 03052443 A2 | 6/2003 |

OTHER PUBLICATIONS

Luedeke, K., et al.; A novel asymmetric RF Body-Coil; 2003; Proc. Intl. Soc. Mag. Reson. Med.; 11; p. 2352.

Overweg, J.A., et al.; A high-efficiency asymmetric Gradient Coil; 2003; Proc. Intl. Soc. Mag. Reson. Med.; 11; 744.

Schenck, J.F., et al.; Design Criteria for a Folded Gradient Coil; 1997; Proc. Intl. Soc. Mag. Reson. Med.; 3; 1468.

Wong, E.C., et al.; Short Cylindrical Transverse Gradient Coils Using Remote Current Return; 1992; Proc. Intl. Soc. Mag. Reson. Med.; p. 583.

* cited by examiner

ASYMMETRIC ULTRA-SHORT GRADIENT COIL FOR MAGNETIC RESONANCE IMAGING SYSTEM

CROSS REFERENCE TO RELATED APPLICATIONS

This application claims the benefit of U.S. provisional application Ser. No. 60/549,751 filed Mar. 3, 2004, which is incorporated herein by reference.

DESCRIPTION

The following relates to the magnetic resonance arts. It finds particular application in magnetic resonance imaging, and will be described with particular reference thereto. However, it also finds application in magnetic resonance spectroscopy and other magnetic resonance techniques.

Magnetic resonance imaging scanners with magnet bores that are short in the axial or z-direction reduce patient claustrophobia and can provide improved access to the patient for interventional procedures. A short bore magnet may, for example, have bore length of 1.0 meters or less.

In short bore magnets, the bore diameter is not scaled downward with the shortening of the bore. A minimum bore diameter is imposed by the cross-section of the imaging subject. Moreover, a reduced bore diameter contributes to patient claustrophobia. Thus, the short bore magnet preferably has a small length-to-diameter ratio. For example, a bore length that is shorter than the bore diameter can be advantageous in a short bore magnet.

If the length of a gradient coil assembly is made smaller, especially if the length-to-diameter ratio is 1.1 or less, the efficiency of the transverse gradient coils becomes worse. This is because the return conductors of the saddle coils from which these coils are made up have to be located closer to the working volume of the coil; this leads to a concentration of magnetic field near the conductors of the gradient coil and hence to an increase in the magnetic stored energy of the coil. The peak power to be delivered to the coil in order to generate a certain gradient field amplitude in a certain time is directly proportional to the coil's stored energy. Thus, in order to limit the size and the cost of the gradient amplifier it is important to minimize the magnetic stored energy of a coil. For the gradient coil generating the gradient field in the z-direction the reduction of efficiency on reducing the length is far less severe than for the transverse coils.

The present invention contemplates an improved apparatus and method that overcomes the aforementioned limitations and others.

According to one aspect, a magnetic field gradient coil is disclosed for a short-bore magnetic resonance imaging scanner. Upper and lower magnetic field gradient coil windings define a subject-receiving bore and generate transverse magnetic field gradients imposed on an associated static magnetic field generally oriented in a longitudinal direction through the bore. The upper gradient coil winding have an arcuate curvature ($C_{upper}$) transverse to the longitudinal direction and a longitudinal length ($L_{upper}$) in the longitudinal direction that is smaller than a longitudinal length ($L_{lower}$) of the lower gradient coil winding.

According to another aspect, a magnetic resonance imaging scanner is disclosed. A housing has (i) an imaging volume imaged by the scanner and (ii) an imaging subject support section disposed below the imaging volume. The imaging subject support section extends beyond a length of a magnet bore. A radio frequency coil is arranged to inject a radio frequency signal into the scanner bore. A magnetic field gradient coil includes a lower section disposed in the imaging subject support section of the housing and an upper section that together with the lower section define a coil bore containing the imaging volume. The upper section has an arcuate curvature and coil windings spanning a first length. The lower section has coil windings spanning a second length greater than the first length.

According to yet another aspect, a method of magnetic resonance imaging is provided. A main magnetic field is generated through a subject receiving bore. Magnetic field gradients are generated across the bore with a combination of (i) upper gradient coils that have a first longitudinal length ($L_{upper}$) shorter than a diameter ($D_{bore}$) of the bore and (ii) lower gradient coils that have a second longitudinal length ($L_{lower}$) longer than the diameter of the bore. The first longitudinal length ($L_{upper}$) is generally shorter than a length of the bore and the second longitudinal length ($L_{lower}$) is substantially equal or longer than a length of the bore.

One advantage resides in providing a magnetic resonance imaging apparatus having a reduced bore length as seen by the patient, but with a much higher gradient efficiency than for a prior art short-bore gradient coil allowing a comparable bore shape above the patient support.

Another advantage resides in efficient use of space in the horizontally extended bottom section of a short-bore magnetic resonance imaging system.

Yet another advantage resides in providing an asymmetric short gradient coil that provides symmetric gradients in two transverse in-plane directions.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIGS. 1A and 1B diagrammatically show side and end views, respectively, of a magnetic resonance imaging system including a short asymmetric magnetic field gradient coil.

Figure 1B:
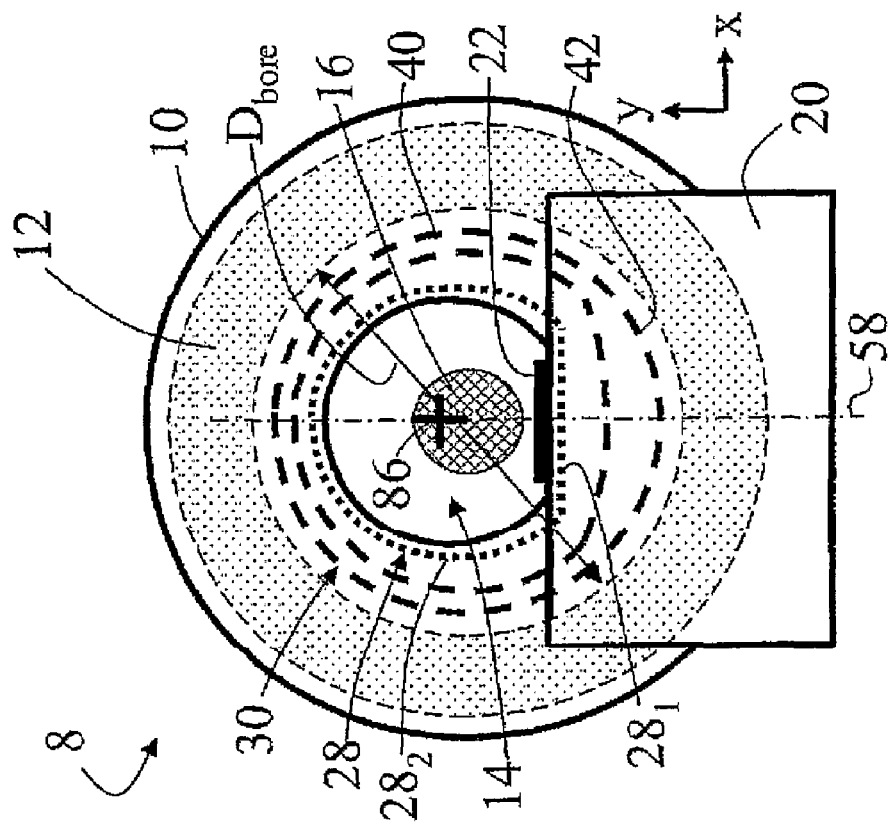
Figure 1A:
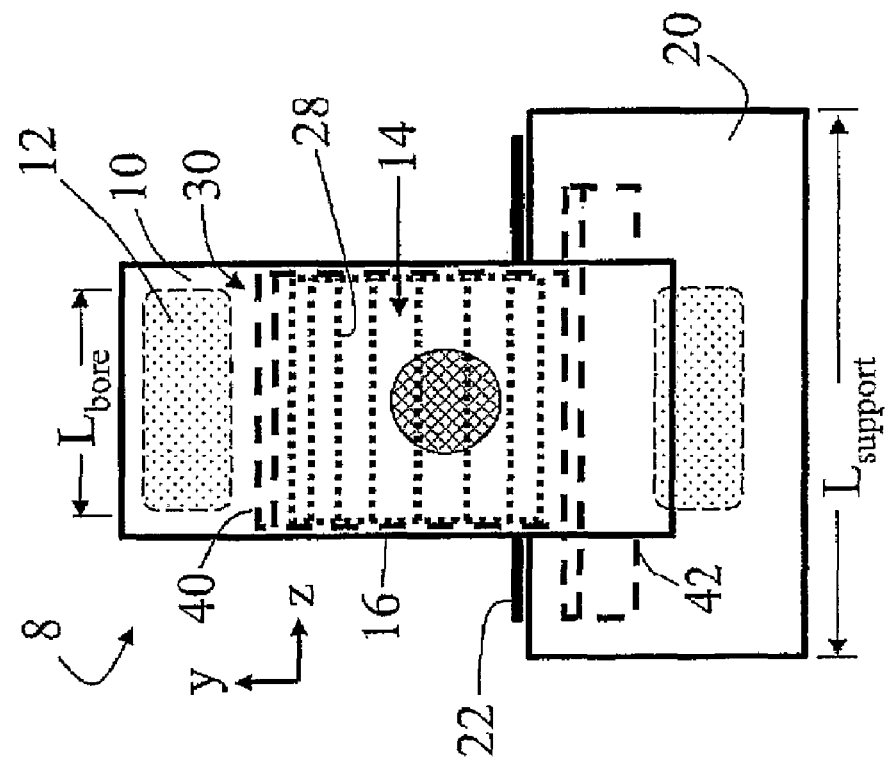

With reference to FIGS. 1A and 1B, a magnetic resonance imaging scanner 8 includes a housing 10 defining a generally cylindrical scanner bore seen by the patient. Main magnetic field generating coils 12 define a magnet bore 14 contains a scanner imaging volume 16 (indicated diagrammatically by a cross-hatched area) over which the magnetic resonance imaging scanner 8 is configured to image. The housing includes an imaging subject support section 20 disposed below the imaging volume 16. A human or other imaging subject is introduced into the scanner bore for imaging, typically on a pallet 22 or other support that slides into the scanner bore on an upper substantially planar surface of the imaging subject support section 20 defining the bottom of the bore. The magnet bore 14 has a bore length $L_{bore}$ along a longitudinal direction, and a diameter $D_{bore}$ transverse to the longitudinal direction. In a preferred embodiment, the bore length $L_{bore}$ is about the same as or shorter than the bore diameter $D_{bore}$. That is, for a short bore scanner the $L_{bore}/D_{bore}$ ratio is less than or about unity.

The subject support section 20 has a longitudinal length $L_{support}$ that is larger than the bore length $L_{bore}$. The shorter bore length $L_{bore}$ reduces patient claustrophobia and facilitates insertion and manipulation of interventional instruments such as a catheter during imaging. The housing 10 contains or supports a radio frequency coil 28 (shown in dotted phantom lines), a magnetic field gradient coil 30 (shown in dashed phantom lines), and the main magnetic field generating coils 12, which are typically cryoshrouded superconducting coils. The magnetic field gradient coil 30 is used to generate transverse gradients, such as gradients in the x-y plane. An additional z-gradient coil (not drawn in FIGS. 1A and 1B) provides magnetic field gradients along the longitudinal or z-direction.

The main magnetic field generating coils 12 generate a temporally static and substantially uniform main $B_0$ magnetic field generally directed in the z-direction in the Cartesian coordinates system of FIGS. 1A and 1B. The radio frequency coil 28 is selectively energized to excite magnetic resonances in the imaging volume 16. The magnetic field gradient coil 30 is selectively energized to produce one or more selected magnetic field gradients in the imaging volume 16 to spatially encode the magnetic resonances. Magnetic resonance signals are generated and spatially encoded by the gradient fields. Magnetic resonance signals are received by the radio frequency coil 28 or by another coil, and are reconstructed using a Fourier transform-based reconstruction algorithm, a filtered backprojection-based reconstruction, or another suitable reconstruction algorithm. The reconstructed image is displayed, printed, stored, or otherwise utilized.

The radio frequency coil 28 is in the illustrated embodiment an asymmetric coil or coil array having a substantially flat lower portion $28_1$ and a circularly arcuate upper portion $28_2$. The lower and upper portions $28_1$, $28_2$ of the radio frequency coil 28 comport with the asymmetry of the bore and enable the coil 28 to be disposed close to the imaging volume 16. Suitable asymmetric radio frequency coils are described, for example, in Overweg et al., U.S. Pat. No. 6,462,636, and in Leussler, international publication number WO 02/095435 A1. Alternatively, a symmetric coil, such as a cylindrical birdcage coil, can be employed. Moreover, local coils can be used in conjunction with or in place of the whole-body radio frequency coil 28. In one embodiment, for example, the whole body coil 28 is used to excite magnetic resonance, and one or more local receive coils are used to receive the magnetic resonance signals.

Figure 2:
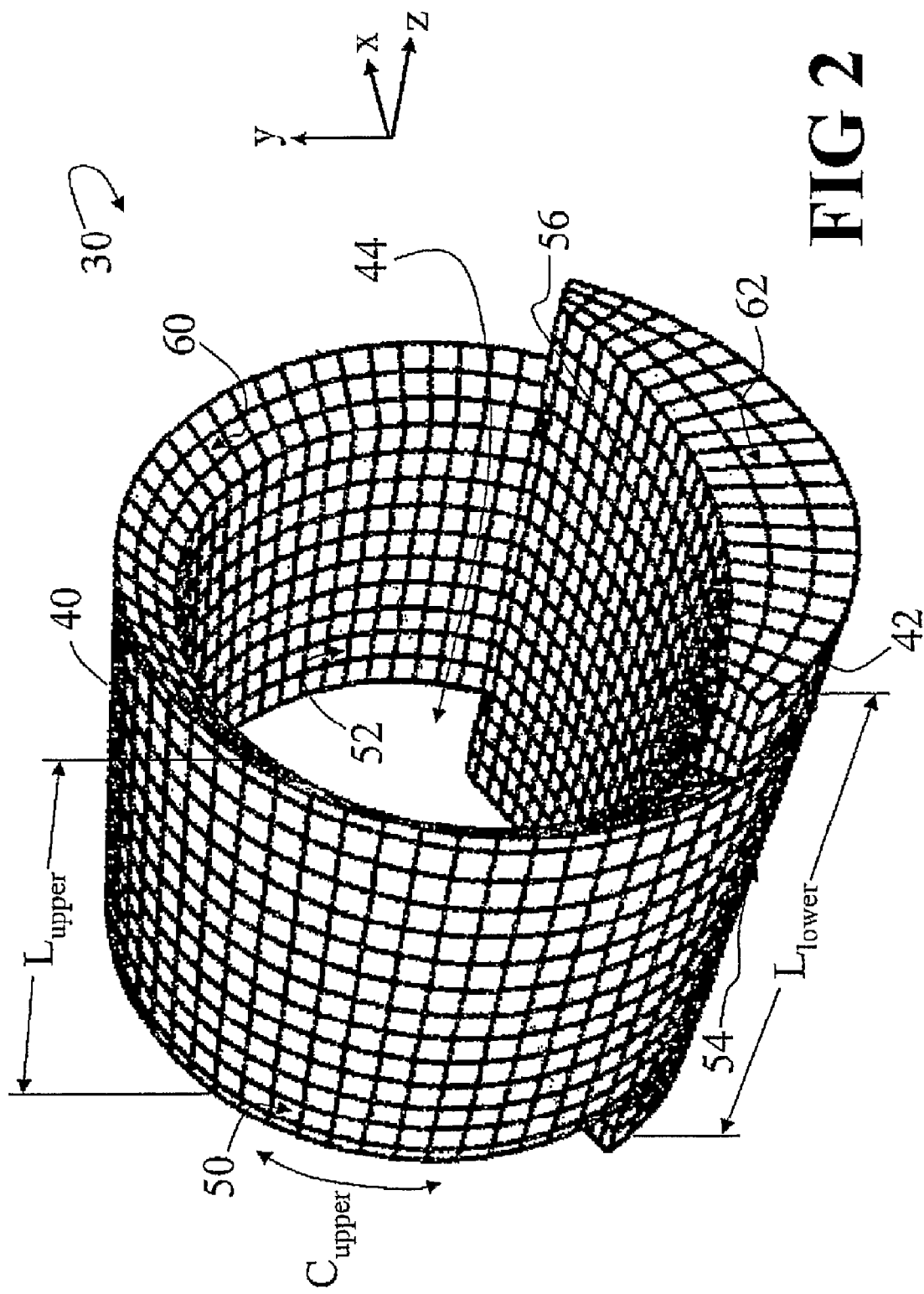
FIG. 2 shows a perspective view of a wire-frame representation of the coils support of the short asymmetric magnetic field gradient coil of FIG. 1.

With continuing reference to FIGS. 1A and 1B and with further reference to FIG. 2, the mechanical coil support of the magnetic field gradient coil 30 is divided into an upper section 40 and a lower section 42. The upper section 40 has a length $L_{upper}$ along the longitudinal direction (that is, the z-direction in the case of a horizontal bore magnet using the Cartesian coordinate system of FIGS. 1A, 1B, and 2). The lower section 42 has a length $L_{lower}$ that is larger than the longitudinal length $L_{upper}$ of the upper section 40. The upper and lower sections 40, 42 cooperatively define a coil bore 44 therein.

The upper section 40 of the coils support has an arcuate curvature $C_{upper}$ (indicated by a curved double-headed arrow in FIG. 2) transverse to the longitudinal direction, and substantially no curvature in the longitudinal direction, although it could flare outward toward the outer ends. The upper section 40 defines an outer surface 50 and an inner, coil bore-defining surface 52. The lower section 42 of the coil support also defines an outer surface 54 and an inner, coil bore-defining surface 56. The outer surface 54 of the lower section 42 has substantially the same curvature as the arcuate curvature $C_{upper}$ of the upper section 40, so that the outer surface 50, 54 of the gradient coil 30 has a circular, oval, or other smooth cross-section. However, the inner coil bore-defining surface 56 of the lower section 42 is more planar, e.g., conformal to a lower surface of the patient pallet 22, so that the lower surface 56 is disposed closer to the imaging volume 16 than it would be if it had the arcuate curvature $C_{upper}$. The illustrated coil 30 has bilateral symmetry with respect to a symmetry plane 58 parallel to the y-z plane (coil symmetry plane 58 is labeled in FIG. 1B).

Although the inner coil bore-defining surface 56 of the lower section 42 is substantially planar, it may have some curvature illustrated in FIGS. 1B and 2, which however is substantially less than the arcuate curvature $C_{upper}$ of the upper section 40. In another embodiment, the inner coil bore-defining surface 56 has the arcuate curvature $C_{upper}$ so that the inner coil bore-defining surfaces of the coil have a circular, oval, or other smooth cross-section. The upper and lower surfaces 50, 52 of the arcuate upper section 40 are connected by a flared connecting surface 60 that has an angle other than 90° respective to the coil bore-defining surface 52. In the illustrated embodiment, the flared surface 60 has an angle of about 45° with respect to the coil bore-defining surface 52. The upper and lower surfaces 54, 56 of the lower section 50 are connected by a connecting surface 62 that has an angle of 90° respective to the coil bore-defining surface 56. The illustrated embodiment which uses the flared connecting surface 60 for the arcuate upper section 40 and facilitates flaring the scanner bore outward near ends of the bore. Such flaring can further reduce patient claustrophobia by making the scanner bore seem more "open," and can improve access. However, it is also contemplated to use orthogonal connecting surfaces for both sections, or to use flared connecting surfaces for both sections, or to use an orthogonal connecting surface for the upper section and a flared connecting surface for the lower section.

Figure 3:
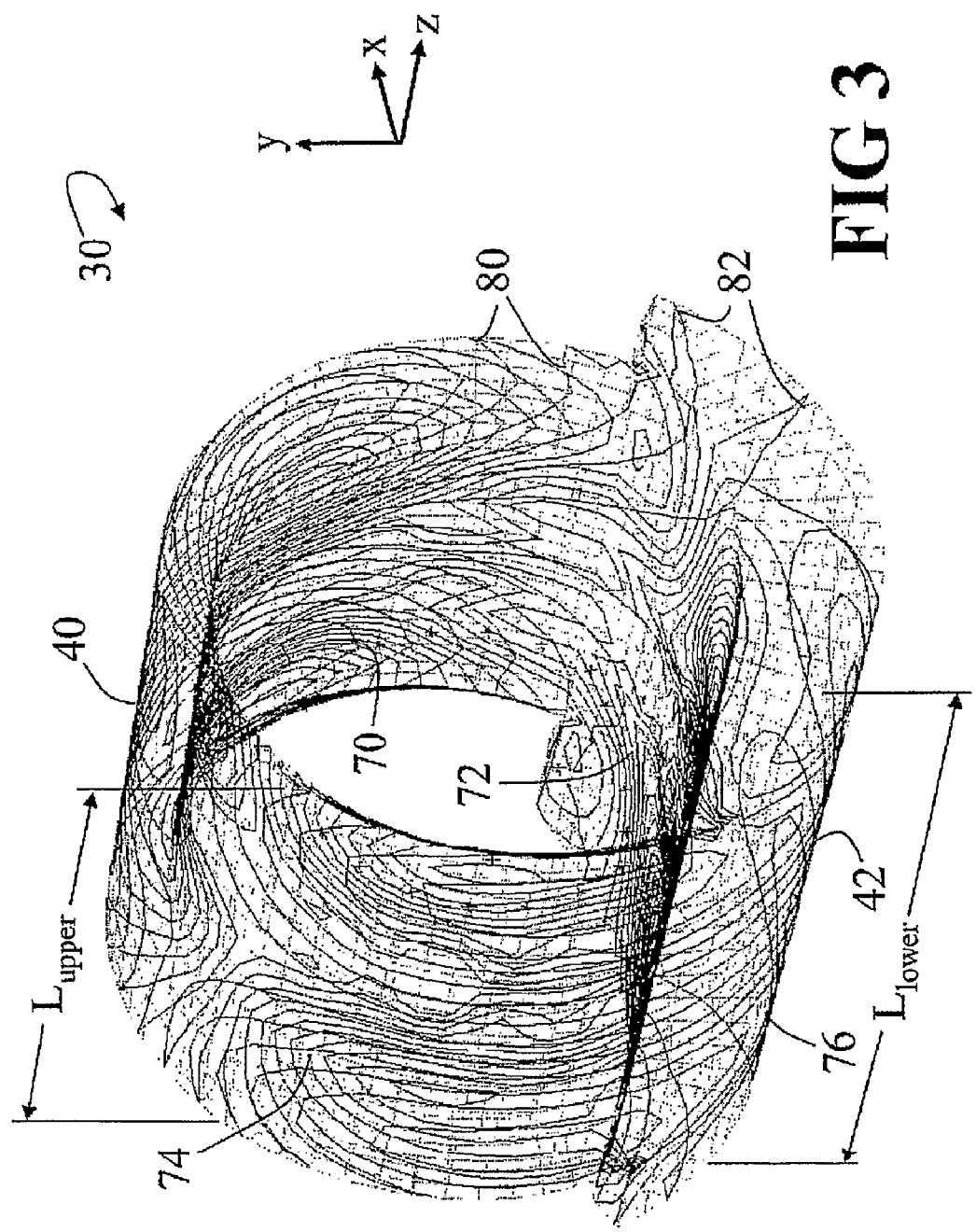
FIG. 3 shows a perspective view of the wire-frame representation of FIG. 2 with the primary and shield coils layout superimposed thereon.

With continuing reference to FIGS. 1A, 1B, and 2, and with further reference to FIG. 3, the magnetic field gradient coil 30 includes coil windings. Specifically, primary coil windings 70, 72 are disposed on the coil bore-defining surfaces 52, 56 of the upper and lower sections 40, 42, respectively. Shield coil windings 74, 76 are disposed on the outer surfaces 50, 54 of the upper and lower sections 40, 42, respectively. The primary and shield windings 70, 74 disposed on the upper section 40 are limited in longitudinal distribution to the longitudinal length $L_{upper}$ of the upper section 40. The primary and shield windings 72, 76 disposed on the lower section 42 are longitudinally distributed across substantially the longitudinal length $L_{lower}$ of the lower section 42. At least some of the individual primary windings 70, 74, may be connected to some of the shield windings 72, 76 by field-generating conductors located on the flared connecting surface 60.

While the coil windings 70, 72, 74, 76 are described as being disposed on the outer and inner coil bore-defining surfaces of the upper and lower sections 40, 42 of the coils support, it is to be appreciated that these windings may be encapsulated or sealed in a resin or epoxy, may be covered or sealed by a dielectric shell, or the like. In the case where more than one gradient winding, such as both vertical and horizontal transverse gradient windings, are disposed on the same surface, a dielectric shell or other insulating separator is suitably disposed between the vertical and horizontal windings to ensure electrical isolation. Moreover, it is contemplated to dispose some or all the windings inside of the coils support. Still further, while in the illustrated embodiment both primary and shield windings are included on a single coils support, it is contemplated to omit the shield windings or to move the shield windings onto a separate coils support.

The primary coil windings 70, 72 are electrically connected in series or in another electrical configuration to define one or more transverse gradient coils that when energized impose one or more transverse gradients on the main $B_0$ magnetic field produced by the main magnetic field generating coils 12. The shield windings 74 are connected with corresponding primary windings 70 across the flared connecting surface 60 by connecting conductors 80. Similarly, the primary and shield windings 72, 76 of the lower section 42 are connected across the connecting surface 62 by connecting conductors 82, so that energizing the primary coils 70, 72 also energizes the shield coils 74, 76 to produce a magnetic field gradient in the scanner imaging volume 16 with limited stray magnetic fields being produced outside of the gradient coil 30.

The larger longitudinal length of the distribution of lower coil windings 72, 76, which are distributed substantially coextensive with the longitudinal length $L_{lower}$ of the lower section 42 of the coil support, versus the longitudinal length of the distribution of upper coil windings 70, 74 which are limited to the longitudinal length $L_{upper}$ of the upper section 40 of the coil support, has certain advantages. The return conductors of the saddle coils in the extended length section 72, 76 are further away from the working volume of the gradient coil and produce less field opposing the desired gradient field. The number of turns required for a certain gradient strength at certain operating current can thus be reduced. This reduces the magnetic field at the conductors and hence the total magnetic stored energy of the coil. This reduction of the stored energy may be a factor of 2-4 compared to a short gradient cylindrical coil of constant length. The upper portion of the coil 30 is limited to the longitudinal length $L_{upper}$ of the upper section 40 of the coils support. In the illustrated embodiment, the longitudinal length $L_{upper}$ is substantially equal to the bore length $L_{bore}$ of the magnet bore 14. The gradient coil 30 thus just fits into the upper portion of the housing 10, as shown in FIG. 1A. The longer longitudinal length $L_{lower}$ of the lower section 42 of the coil 30 is readily accommodated by the longitudinally longer imaging subject support section 20 disposed below the imaging volume 16, which has a length $L_{support} > L_{bore}$.

Longitudinal stretching of the magnetic gradient field generating windings is particularly advantageous for scanners in which the cross-section of the magnet bore 14 is about the same size as, or larger than, the bore length $L_{bore}$. In such short bore configurations, it is otherwise difficult to generate strong and fast-switching gradient fields because of the inherent inefficiency of short gradient coils. The longitudinal length $L_{lower}$ of the lower section 42 typically extends beyond the length $L_{bore}$ of the magnet bore 14. In scanners with longer bores, it may be beneficial to reduce the length of the upper part of the gradient coil in order to increase the openness of the system. The gradient coil with increased lower length may also be useful for head-only scanners, where the diameter of the gradient coil is so small that the shoulders of the patient do not fit into the bore.

The magnetic field gradient coil 30 is asymmetric in the vertical or y-direction, being longitudinally shorter at top than at bottom. This vertical non-uniformity can introduce gradient non-uniformity in the vertical direction. Such gradient non-uniformity is suitably compensated by using a relatively higher windings density for coil windings 70, 74 disposed on the shorter arcuate upper section 40 of the coils support, and a relatively lower windings density for coil windings 72, 76 disposed on the longer lower section 42 of the coils support. With particular reference to FIG. 1B, in yet another approach for improving the efficiency of the magnetic field gradient coil 30, the windings 70, 72, 74, 76 are designed to produce a zero point 86 of the vertical (y-) magnetic field gradient (indicated by cross-hairs in FIG. 1B) that is displaced vertically upward relative to the imaging volume 16. That is, the gradient coil windings 70, 72, 74, 76 are designed to provide a zero z-component of the field in a horizontal plane through the zero point 86 which is above the geometric center of the scanner imaging volume 16. By moving the zero point 86 relatively closer to the short upper section 40 and relatively farther from the long lower section 42, the relative contribution of the upper part 40 of the gradient coil 30 and hence the contribution of this part of the coil to the total magnetic stored energy are further reduced. The more efficient lower part 42 of the coil 30 has to generate more field but the total effect of the move of the zero-field plane is an improvement in the efficiency of the coil.

In designing the coil windings 70, 72, 74, 76, any combination of the above techniques, including using a higher density of windings at top versus bottom, and/or moving the zero point vertically upward, can be used during finite element model optimization or other design of the coil windings 70, 72, 74, 76. In designing the coil windings 70, 72, 74, 76, the physical geometry and dimensions of the upper and lower sections 40, 42 of the coils support is also input into the finite element model optimization or other design optimization.

The magnetic field gradient coil 30 was simulated using a method described in G. N. Peeren, "Stream function approach for determining optimal surface currents," Journal of Computational Physics vol. 191, no. 1, pp. 305-321 (2003). Example simulation parameters included a length-to-diameter ratio of the inner gradient coil windings of 0.7, which is suitable for use in a short bore magnetic resonance imaging scanner having a magnet bore length/diameter ratio ($L_{bore}$/$D_{bore}$ in FIGS. 1A and 1B) of less than unity. The stored energy of the simulated vertical transverse gradient channel was about 2 joules, and the stored energy of the simulated horizontal transverse gradient channel was about 4 joules. These simulation results are for the coil 30 in which the lower longitudinal length $L_{lower}$ is greater than the upper longitudinal length $L_{upper}$. For comparison, when the coil simulation was modified by reducing $L_{lower}$ to equal $L_{upper}$, and setting the internal shape of the coil to a cylinder, then the stored energy of the simulated transverse gradient channels increased to about 7 joules for both vertical and horizontal channels.

Figure 4:
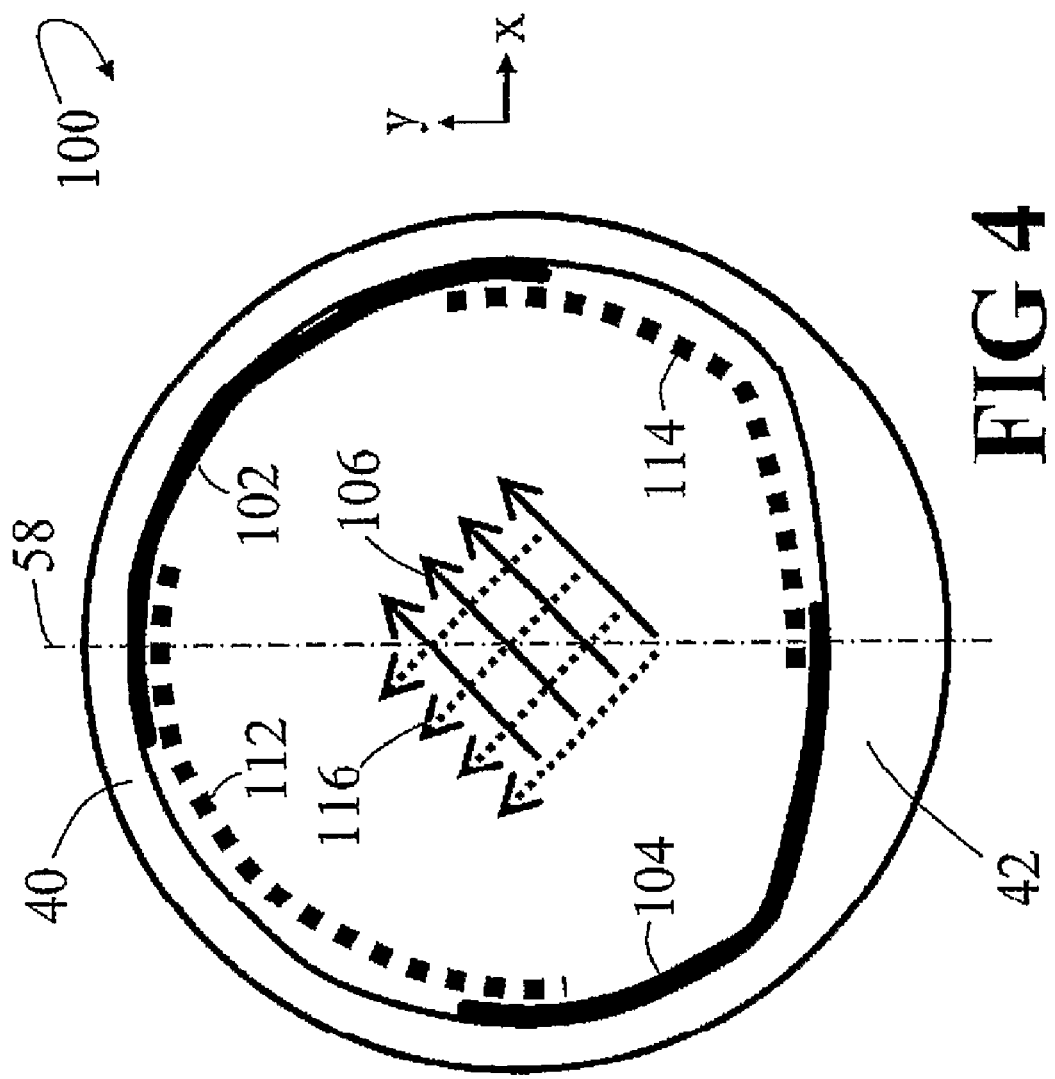
FIG. 4 shows an end view of the coils support of FIG. 2 with coil windings configured to produce two transverse gradients that are symmetrically arranged with respect to a bilateral symmetry of the magnetic field gradient coil.

With reference to FIG. 4, in another embodiment, a magnetic field gradient coil 100 suitably including the coils support 40, 42 has a first gradient coils set 102, 104 arranged to produce a first magnetic field gradient 106. The coil 100 also has a second gradient coils set 112, 114 arranged to produce a second magnetic field gradient 116. The first magnetic field gradient 106 is directed at a 45° angle respective to the symmetry plane 58 of bilaterally symmetric coils support 40, 42. Similarly, the second magnetic field gradient 116 is also directed at a 45° angle respective to the symmetry plane 58. The magnetic field gradients 106, 116 are transverse to one another.

The embodiment of FIG. 4 advantageously has the two transverse magnetic field gradients 106, 116 symmetrically oriented with respect to the bilateral symmetry plane 58. As a result, in simulations the stored energy of each of the two magnetic field gradients 106, 116 is the same, specifically about 3.3 joules for the example simulation parameters including a length-to-diameter ratio of 0.7.

Comparison with FIGS. 2 and 3 demonstrates that the coils 102 of the first gradient coils set and the coils 112 of the second coils set are disposed on inner coil bore-defining surface 52 of the upper section 40 of the coils support. That is, these coils are part of the primary coil windings 70 for embodiments generating symmetric transverse gradients 106, 116. On the other hand, the coils 104 of the first gradient coils set and the coils 114 of the second coils set are disposed on both inner coil bore-defining surfaces 52, 56 of the upper and lower sections 40, 42 of the coils support. That is, the coils 104, 114 are part of the primary coil windings 70, 72 for embodiments employing symmetric transverse gradients 106, 116.

Although a horizontal bore scanner has been described herein, the magnetic field gradient coils 30, 100 are readily adapted for use in a vertical magnet scanner, by re-orienting the coil so that the longitudinal direction (corresponding to the z-direction in the horizontal scanner) is oriented vertically.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic field gradient coil for a short-bore magnetic resonance imaging scanner, the gradient coil comprising:
   upper and lower magnetic field gradient coil windings that define a subject-receiving bore and which generate transverse magnetic field gradients imposed on an associated static magnetic field generally oriented in a longitudinal direction through the bore, the upper gradient coil winding having an arcuate curvature transverse to the longitudinal direction and a longitudinal length in the longitudinal direction that is smaller than a longitudinal length of the lower gradient coil winding.

2. The gradient coil as set forth in claim 1, further including:
   a coil support including an upper section supporting the upper magnetic field gradient coil winding and a lower section supporting the lower magnetic field gradient coil winding.

3. The gradient coil as set forth in claim 2, wherein the upper and lower magnetic field gradient coil windings include:
   primary coil windings disposed on coil bore-defining surfaces of both the upper and lower sections of the coils support; and
   shield coil windings disposed on outer surfaces of both the upper and lower sections of the coils support.

4. The gradient coil as set forth in claim 3, further comprising:
   connecting conductors extending across an edge of the lower section between the coil bore-defining surface and the outer surface, the connecting conductors electrically connecting the primary and shield coil windings.

5. The gradient coil as set forth in claim 1, wherein:
   the arcuate curvature of the upper gradient coil windings lies generally along a portion of a circular or oval cross-section; and
   the lower gradient coil windings include primary windings that are substantially planar compared with the arcuate curvature of the upper gradient coil windings.

6. The gradient coil as set forth in claim 5, wherein the lower gradient coil windings further include
   shield coil windings lying generally along an arcuate curvature matching the arcuate curvature of the upper coil windings such that the upper gradient coil windings and the shield coil windings of the lower gradient coil windings have one of a circular cross-section and an oval cross-section.

7. The gradient coil as set forth in claim 6, wherein the upper coil windings further include:
   primary coil windings and shield coil windings each defining curved surfaces having the arcuate curvature, the defined curved surfaces being spaced apart a separation distance transverse to the longitudinal direction;
   connecting conductors disposed at longitudinal ends of the upper coil windings and electrically connecting the primary coil windings and the shield coil windings by spanning the separation distance along a flared annular connecting surface having an angle other than 90° respective to the longitudinal direction.

8. The gradient coil as set forth in claim 1, wherein the longitudinal length of the upper gradient coil windings is about the same as or less than a dimension of the coil bore transverse to the longitudinal direction.

9. The gradient coil as set forth in claim 8, wherein a ratio of the longitudinal length of the upper gradient coil windings to the dimension of the coil bore transverse to the longitudinal direction is less than or about 0.7.

10. The gradient coil as set forth in claim 1, wherein the magnetic field gradient coil windings include:
    a first sub-set of the windings that when energized produce a first magnetic field gradient oriented transverse to the longitudinal direction and parallel to a plane of bilateral symmetry of the gradient coil windings; and
    a second sub-set of the windings that when energized produce a second magnetic field gradient oriented transverse to the longitudinal direction and transverse to the plane of bilateral symmetry of the gradient coil windings.

11. The gradient coil as set forth in claim 10, wherein the first magnetic field gradient has a zero-field point displaced toward the upper gradient coil winding relative to an imaging volume that is surrounded by the gradient coil.

12. The gradient coil as set forth in claim 1, wherein the magnetic field gradient coil windings include:
    a first sub-set of the windings that when energized produce a magnetic field gradient in a first direction oriented transverse to the longitudinal direction and at a 45° angle to a plane of bilateral symmetry of the gradient coil windings; and
    a second sub-set of the windings that when energized produce a magnetic field gradient in a second direction transverse to the longitudinal direction and transverse to the first direction.

13. A magnetic resonance imaging scanner comprising:
    a housing having: (i) an imaging volume imaged by the scanner and (ii) an imaging subject support section disposed below the imaging volume, the imaging subject support section extending beyond a length of a magnet bore;
    a radio frequency coil arranged to inject a radio frequency signal into the imaging volume; and
    a magnetic field gradient coil including a lower section disposed in the imaging subject support section of the housing and an upper section that together with the lower section define a coil bore containing the imaging volume, the upper section having an arcuate curvature and coil windings spanning a first length, the lower section having coil windings spanning a second length greater than the first length.

14. The imaging scanner as set forth in claim 13, wherein the coil windings of the magnetic field gradient coil include:
   a first set of windings that when energized produce a vertical magnetic field gradient imposed on an associated generally horizontal magnetic field at least in the imaging volume.

15. The imaging scanner as set forth in claim 14, wherein the vertical magnetic field gradient has a zero-field point displaced vertically upward relative to the imaging volume.

16. The imaging scanner as set forth in claim 14, wherein the magnetic field gradient coil windings further include:
   a second set of windings that when energized produce a horizontal magnetic field gradient imposed on the associated generally horizontal magnetic field at least in the imaging volume.

17. The imaging scanner as set forth in claim 13, wherein the magnetic field gradient coil windings when energized produce one or more magnetic field gradients imposed on an associated generally horizontal magnetic field at least in the imaging volume, the magnetic field gradient coil windings including at least:
   a first set of windings that when energized produce a first magnetic field gradient oriented at a 45° angle to the horizontal; and
   a second set of windings that when energized produce a second magnetic field gradient oriented at a 45° angle to the horizontal and oriented transverse to the first magnetic field gradient.

18. The imaging scanner as set forth in claim 13, wherein the second length spanned by coil windings of the lower section is greater than the bore length.

19. The imaging scanner as set forth in claim 13, wherein the radio frequency coil includes:
   a generally planar lower section disposed in the imaging subject support section of the housing; and
   an arcuate upper section that together with the lower section define a radio frequency coil bore contain the imaging volume.

\* \* \* \* \*